United States Patent [19]
Sugimoto et al.

[11] Patent Number: 5,468,960
[45] Date of Patent: Nov. 21, 1995

[54] PYROELECTRIC INFRARED DETECTOR

[75] Inventors: Tadashi Sugimoto, Koga; Shingo Ohkawa, Otsu; Hiroyuki Amano, Otsu; Norikazu Murata, Otsu, all of Japan

[73] Assignee: Optex Co., Ltd., Shiga, Japan

[21] Appl. No.: 241,222

[22] Filed: May 10, 1994

[30] Foreign Application Priority Data

May 12, 1993 [JP] Japan ................................. 5-110116
Dec. 27, 1993 [JP] Japan ................................. 5-329394

[51] Int. Cl.$^6$ ................................................. G01J 5/06
[52] U.S. Cl. .................. 250/338.3; 250/349; 250/DIG. 1
[58] Field of Search .......................... 250/338.2, 338.3, 250/342, 349, DIG. 1; 340/567, 600

[56] References Cited

U.S. PATENT DOCUMENTS 4,441,023  4/1984  Doctor et al. ...................... 250/349 X
4,697,081  9/1987  Baker ................................... 250/338.3
4,800,278  1/1989  Taniguti et al. .................. 250/338.3 X

FOREIGN PATENT DOCUMENTS 337692   10/1989  European Pat. Off. ............ 250/338.3
281104   8/1990   Germany ............................ 250/338.3
56-60324 5/1981   Japan ................................. 250/338.3
58-58424 4/1983   Japan ................................. 250/338.3
2133615  7/1984   United Kingdom ................ 250/338.3

Primary Examiner—Carolyn E. Fields
Assistant Examiner—Edward J. Glick
Attorney, Agent, or Firm—Panitch Schwarze Jacobs & Nadel

[57] ABSTRACT

A pyroelectric infrared detector used in the intrusion detection system, the detector including a housing having an opening, at least two infrared transmissive pyroelectric layers spaced to be mutually free from thermal influence; and a plurality of electrodes formed on the surfaces of each of the pyroelectric layer, the electrodes electrically connected to each other.

16 Claims, 13 Drawing Sheets

Fig. 24(a)
Fig. 24(c)
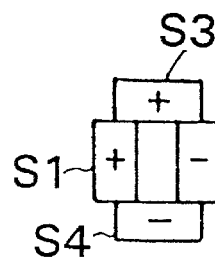
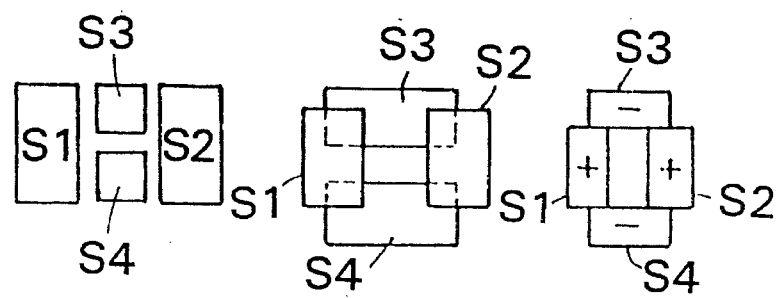
Fig. 24(b)
Fig. 24(d)
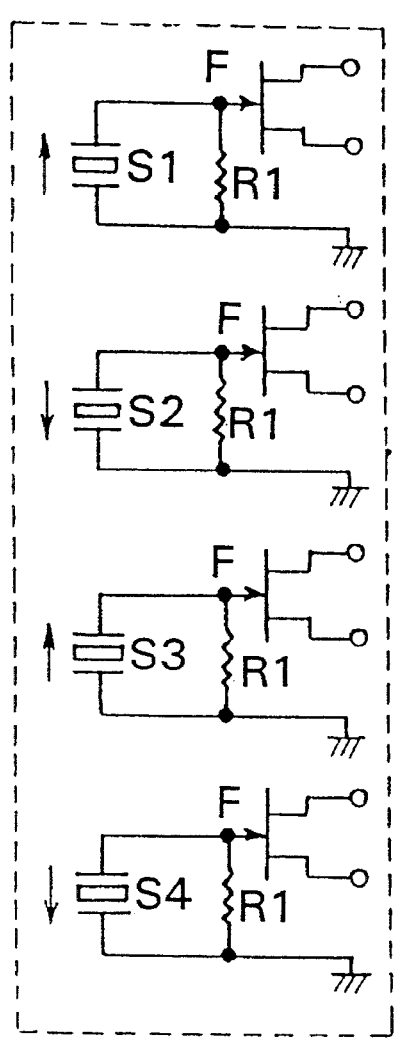
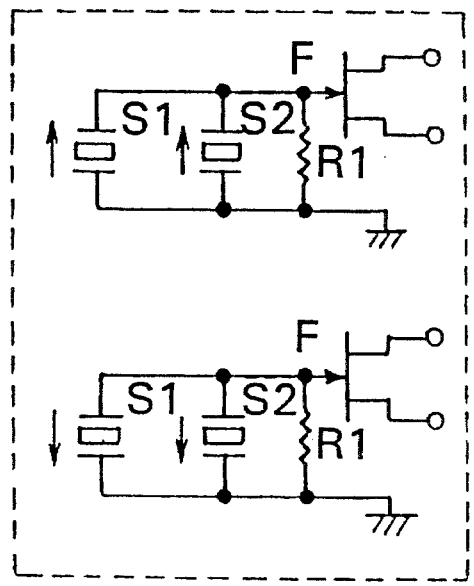
Fig. 25(B)
Fig. 25(A)
Fig. 25(C)
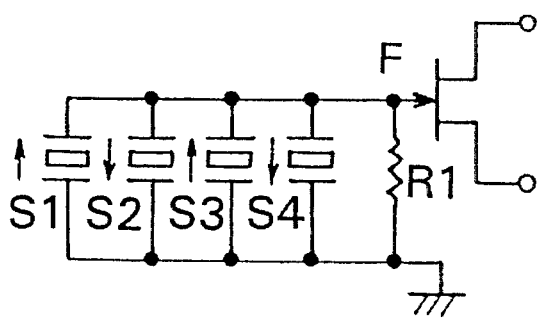

PYROELECTRIC INFRARED DETECTOR

FIELD OF THE INVENTION

The present invention relates generally to an intruder detection system, and more particularly to a pyroelectric infrared detector used in the intruder detection system to prevent the system from giving a false alarm due to the passage of a non-human object through the detection region.

BACKGROUND OF THE INVENTION

In order to detect a moving object entering or approaching a particular site, it is common practice to detect any rise in the level of infrared energy in the detection region above a reference value. This system is called a passive type intrusion detection. The energy level rises by the addition of infrared energy radiated by a moving object within the detection region. Such detectors are usable not only for the intruder detecting system but also for automatic doors as a switch whereby a visiting guest is detected in advance.

The known detection system is liable to an erroneous response due to a sudden rise in the ambient temperature around the detection region by microwave noise, sunlight, or any other interference. In this specification, the "error" means the detection of a signal which is generated by any other object, other than a human such as a dog or cat. The erroneous detection leads to a false alarm.

Referring to FIG. 14, the known intruder detecting system will be described:

The known detection system includes a device for avoiding generating a false alarm. The error protective device comprises a detector 90 having a pair of infrared sensors 90a and 90b (three or more sensors can be used) wherein the sensors 90a and 90b are differentially connected to each other; that is, they are arranged in parallel or in series with opposite polarity. An optical system 91 is positioned for setting up detection regions A1 and A2 covering ordinary human heights. When a human intruder H or an animal M such as a dog passes through the detection regions A1 and A2, the passage through the two regions A1 and A2 takes place at a time interval. The intruder cannot cover the two regions at the same time. This differs point from ambient noise such as sunlight which covers the two regions at the same time. Because of the differential connection of the electrodes, the signals occurring in the regions A1 and A2 are mutually negated, thereby preventing a false signal from being generated. When a human intruder H passes through the detection regions A1 and A2, the human covers the whole space of the detection regions A1 and A2, thereby outputting a signal at a level higher than a reference level. If the moving object is a dog or any other non-human intruder, it only covers a lower part of the detection regions A1 and A2, thereby outputting a signal at a level lower than the reference level. Thus the production of a false alarm due to the passage of a moving object other than a human is avoided.

When a difference between the temperature of the moving object and the ambient temperature is small, an error can be easily avoided as shown in FIGS. 15(A) and 15(B). More specifically, the signal output by a human H is higher than the reference level as shown in FIG. 15(A) whereas the signal output by an animal M is lower than the reference level as shown in FIG. 15(B). When a difference between the temperature of the moving object and the ambient temperature is great, an error is likely to occur as shown in FIG. 16(B), because the signal output by a non-human object M like a dog is likely to exceed the reference level. As FIGS. 16(A) and 16(B) show, it is difficult to distinguish between an intruder and a dog.

In order to solve such problems, the inventor of the present invention has made an invention for which a Japanese Patent Application No. 5 (1993)-226058 is on file. As shown in FIGS. 9 and 10, the device of this prior invention includes sensors a and b to which infrared ray is led from detection region group Ah for a human intruder and group Am for an animal. The sensors a are connected to a first circuit c where all signals from the detection region group Ah are totaled, and the sensors b are connected to a second circuit d (FIG. 10, d') where all signals from the detection region group Am are totaled. Each circuit c and d is connected to a common arithmetic circuit e where a difference between the outputs from the region groups Ah and Am is calculated and a signal is generated.

In operation, when a human passes through the region groups Ah and Am, he or she covers the whole area of each region group Ah and the first circuit c generates a signal having a large peak, and the second circuit d generates a signal having a small peak because the signals arising from the passage of the human through the regions Am are mutually negated. Whereas, if a dog passes through the region group Ah, the generating signal has a small peak because the animal only covers a lower part of the detection region Ah. If a dog passes through the region group Am, the sensor b generates the same signal as the signal generated by the sensor a. In this way, there can be a difference between the signals occurring when a human passes through the detection region groups Ah and Am and when an animal passes therethrough.

FIG. 10 shows a modification in which the detection region group Am has plus and minus regions arranged differently from those shown in FIG. 9. In this embodiment the sensors a and b function in the same manner.

As FIGS. 9 and 10 show, the detection regions (plus and minus) in each group Ah and Am are spaced from one another. This arrangement sacrifices responsiveness. Preferably, the detection regions should be close to each other, or alternatively, they should overlap each other. However, if the detection regions are located close to each other or overlap each other, the sensor arrangement becomes complicated and costly.

SUMMARY OF THE INVENTION

The present invention provides an intruder detection device of simple construction, capable of economical production irrespective of the close location or the partly overlapping arrangement of the detection regions.

The present invention comprises a pyroelectric infrared detector for use in an intrusion detection system. The detector includes a housing having an opening, a light transmissive filter covering the opening and a group of infrared transmissive pyroelectric layers each arranged perpendicular to infrared incidence through the opening. A bottom layer is located beyond the layer group opposite to the opening. The bottom layer comprises an electrical circuit including a field-effect transistor for converting an impedance and a plurality of electrodes formed on the top and bottom surfaces of each of the group layers for transmitting charges occurring on each surface of each layer caused by thermal changes due to the infrared incidence through the opening of the housing. In addition, means are provided for supporting the group of layers and the bottom layer at spaced intervals so that the layers are free from mutual thermal influence.

The detection regions for monitoring a human intruder and a non-human intruder such as an animal can be, located close to each other or alternatively partly overlap each other in a limited area without using a complicated optical and processing system. A human intruder and a non-human intruder can be distinguished irrespective of any difference between the ambient temperature and the temperature of the moving object, thereby avoiding giving a false alarm when a non-human object passes through the detection regions. The total size of the detection system is economically and conveniently reduced.

BRIEF DESCRIPTION OF THE DRAWINGS

FIGS. 24(a) to 24(d) are diagrammatic views showing another example of arrangement of electrodes on the light accepting surface; and FIGS. 25(A) to 25(C) are diagrams showing another example of circuits.

DETAILED DESCRIPTION OF THE PREFERRED EMBODIMENT

Figure 1:
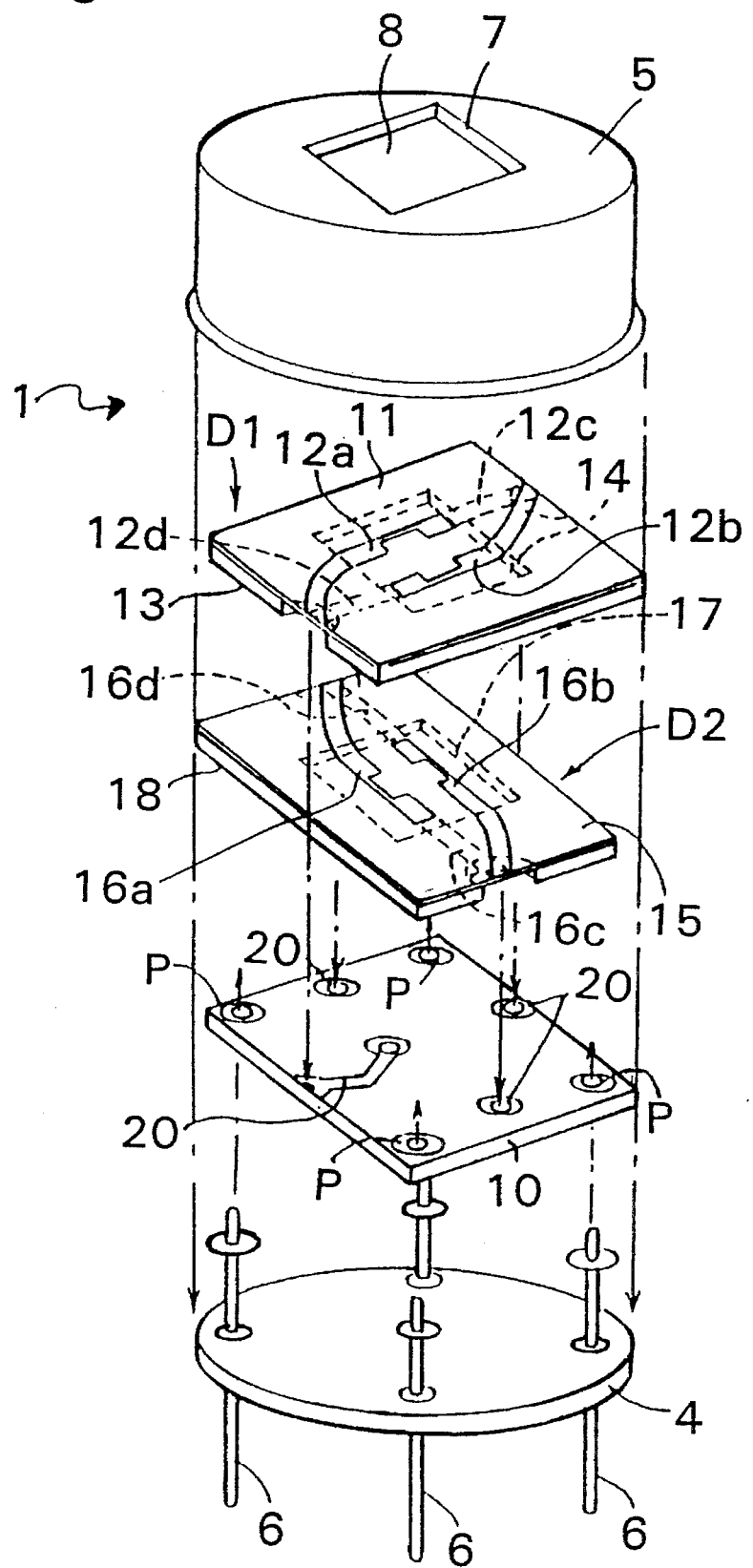
FIG. 1 is a perspective exploded view showing an example of the infrared detector embodying the present invention.
Figure 2:
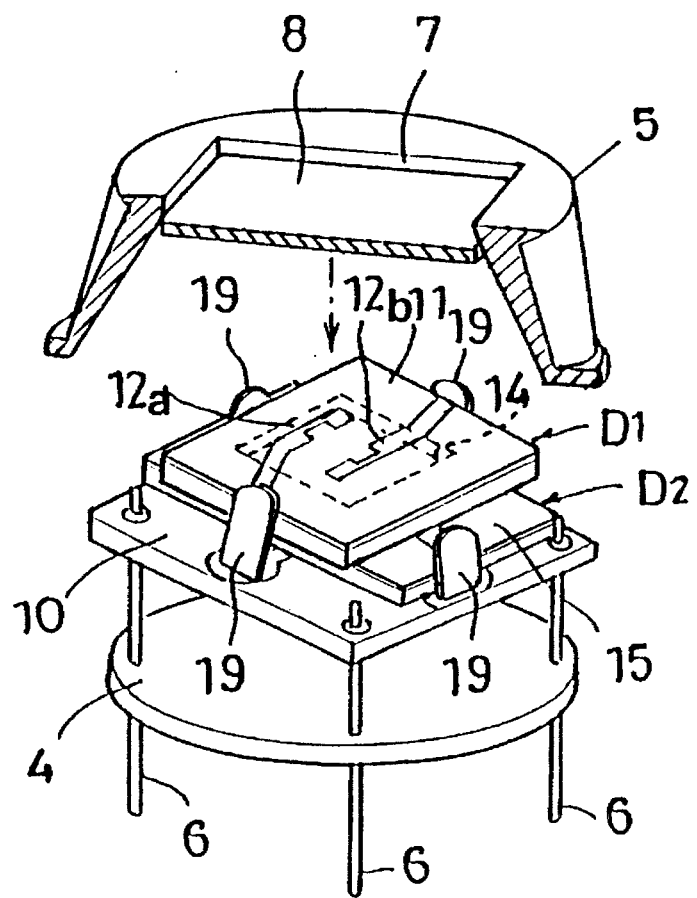
FIG. 2 is a perspective view showing the detector according to the present invention when the cap is removed to show the internal structure.
Figure 3:
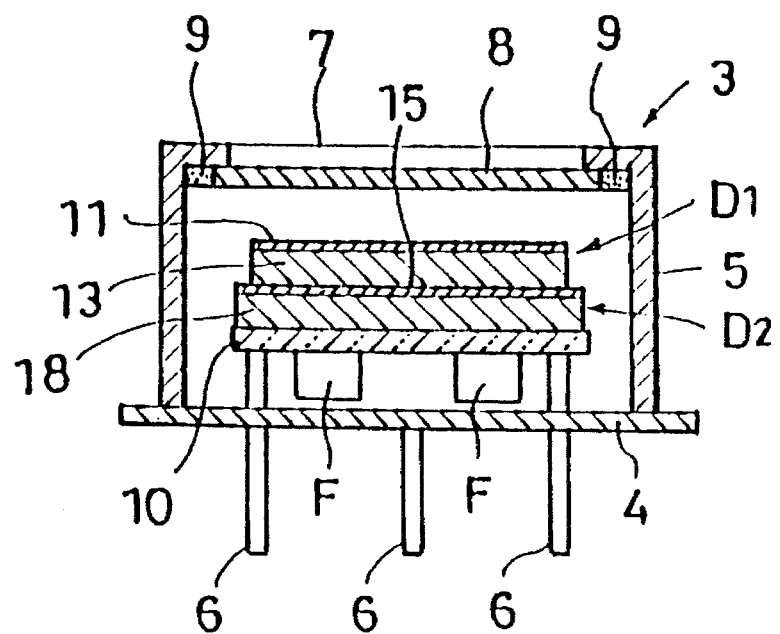
FIG. 3 is a partial cross-sectional view showing the detector shown in FIG. 2.

Referring to FIGS. 1 to 3, the exemplary detector 1 includes a housing 3 supported on a base 2, and a cap 5. Four lead terminals 6 are passed through the base 4 and secured thereto. The ceiling of the cap 5 is provided with a window 7 which admits in light. The window 7 is closed with a light transmissive filter 8 bonded to the inside wall of the ceiling with an adhesive 9. The detector 1 accommodates a circuit substrate 10 and two infrared detecting elements (sensors) D1 and D2 which will be described in detail below.

The substrate 10 is provided with a printed circuit including a field-effect transistor F, and with four output terminals pads P through which the lead terminals 6 are individually passed and fixed. In this way the substrate 10 is supported by the base 4 through the lead terminals 6. The printed circuit is electrically connected to the lead terminals 6.

The sensors D1 and D2 include base plates 13 and 18 each having apertures 14 and 17, the base plates 13 and 18 being covered with pyroelectric films 11 and 15 on their surfaces opposite to the window 7. The films 11 and 15 are made from an infrared ray transmissive substance. If the films 11 and 15 are made of rigid material such as ceramics, the base plates 13 and 18 may be omitted as supporters for the films 11 and 15.

As shown in FIG. 2, the pyroelectric film 11 is provided with electrodes 12a, 12b, 12c, and 12d in band-like pattern formed by vapor deposition. The electrodes 12a and 12b are formed in mutually reverse positions on the top surface of the film 11, the electrodes having broken parts at places corresponding to each other, and the electrodes 12c and 12d in reverse positions on the bottom surface thereof, wherein a greater part of the electrodes 12a and 12c overlap each other with the pyroelectric film 11 interposed therebetween. The overlapping parts constitute two light accepting areas which are located in the path of light through the window 7. The range of the light path is indicated by the chain lines in FIG. 4. In actual use, as shown in FIG. 5 the detector 1 is disposed such that the "top" surface of the films 11 and 15 are toward the outside, that is, in a light incident direction.

Likewise, a greater part of the electrodes 12b and 12d overlap each other with the pyroelectric film 11 interposed therebetween, the overlapping parts constituting two light accepting areas. In FIG. 2, each electrode 12a to 12d reaches the respective edges at which the electrodes 12a and 12d, and 12b and 12c are respectively joined to each other through conductors 19. In this way the sensor D1 has two infrared ray receiving areas. For explanation's sake, in FIG. 4, the vertical direction will be hereinafter referred to as "column", and the horizontal direction will be referred to as "row". Therefore, in FIG. 5, the regions A1 and A2 and A3 and A4 will be referred to as pairs in column, and A1 and A3 and A2 and A4 be as pairs in row.

The sensor D2 is provided with electrodes 16a and 16b on the top surface of the pyroelectric film 15, and electrodes 16c and 16d on the bottom surface thereof, each electrode being in the same pattern as those on the sensor D1. The sensor D2 is placed at a 90° angular displacement to the sensor D1 as shown in FIG. 2. The pyroelectric film 15 of the sensor D2 has a space corresponding to the aperture 14, the space having a depth equal to the thickness of the base plate 13. The space insulates heat against the sensors D1 and D2. The sensor D2 can receive infrared rays through the aperture 14.

The electrodes 12a to 12d are electrically connected to each other through the conductors 19 through which the sensors D1 and D2 are electrically connected to the pads 20 of the circuit substrate 10.

The pyroelectric films 11 and 15 are preferably made of polymetric film such as PVDF, PVDF/PTrFE copolymer or vinyliden cyanide polymer, or alternatively ceramic film such as PLZT-base ceramics. If ceramic is used, the ceramic is a rigid material so that the film 11 and 15 may require no support by the base plates 13 and 18. However, as described above, the use of the base plates 13 and 18 are advantageous in protecting the films 11 and 15 against thermal influence. The pyroelectric film 11 nearer to the window 7 is preferably made of a PLZT-base ceramic obtained by sintering a solid solution of lead titanate and lead zirconium with the addition of lanthanum. This material enhances light transmissivity. The electrodes 12a to 12d and 16a to 16d are preferably formed with nichrome by vapor deposition.

In operation, referring to FIG. 5, an optical system 2 is placed at a suitable position so as to lead infrared rays from a detection region (A) into the detector 1 through the window 7. As described above, the sensors D1 and D2 have four overlapping light accepting areas, that is, a pair in column and a pair in row in correspondence to which the region (A) is divided into detection regions A1 to A4. The detection regions A1 to A4 are spaced at a minimum from one another. The infrared ray is introduced into the light accepting areas of the sensors D1 and D2 through the regions A1 to A4. The height of the region (A) is set to human height. At this stage the sensor D1 is placed toward light in the position shown in FIG. 4, where the electrodes 12a to 12d take a vertical position, whereas as implied from FIG. 1, the electrode 16a to 16d of the sensor D2 take a horizontal position.

Figure 6:
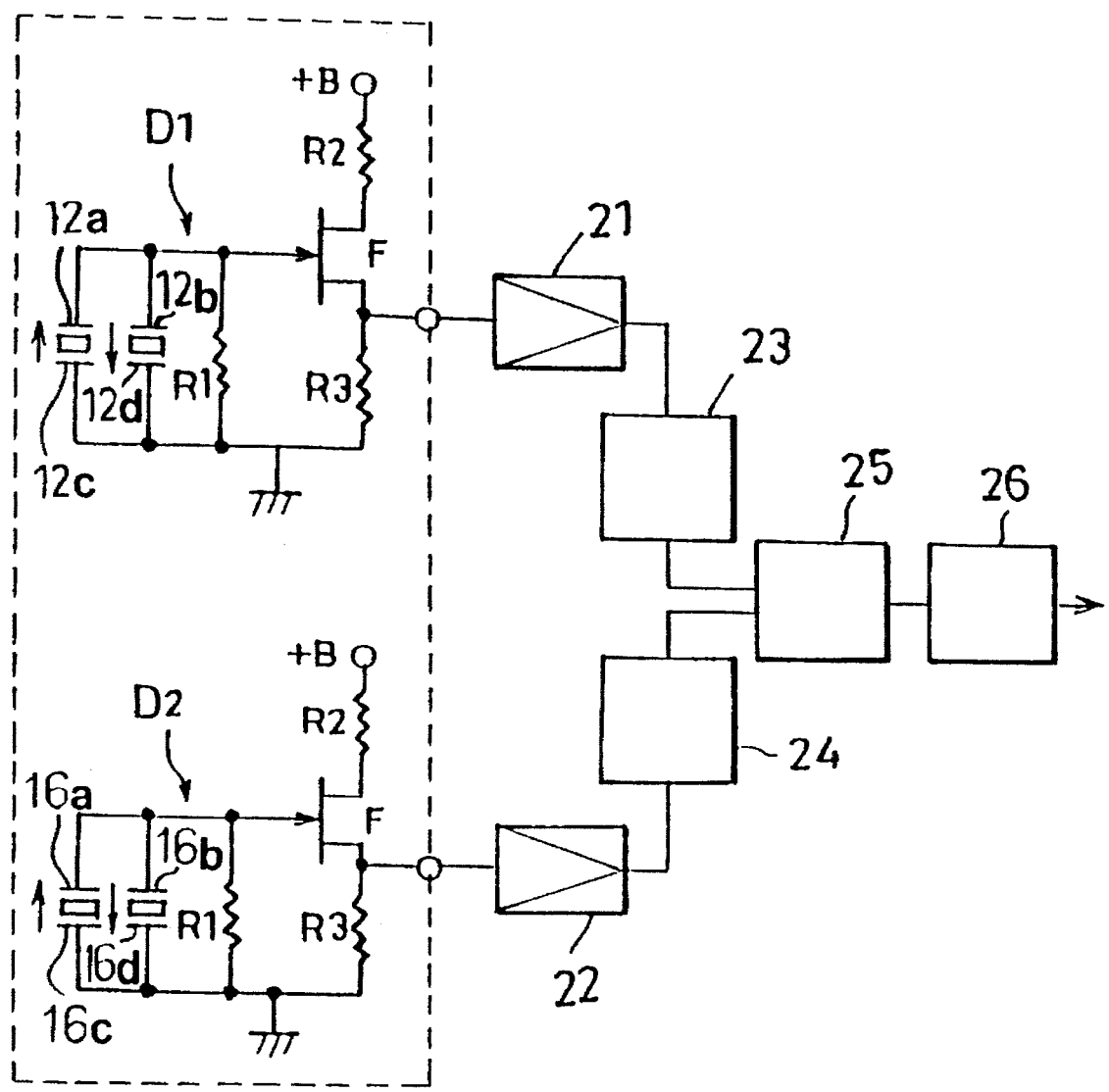
FIG. 6 is a circuit diagram used in the detector of the present invention.

Referring to FIG. 6, in which the region enclosed by dotted lines is a circuit used in the present invention.

As described above, the electrodes 12a and 12b on the top surface of the pyroelectric film 11 and the electrodes 12d and 12c on the bottom surface thereof are respectively connected to each other through the conductor 19. The four light accepting areas are divided into two pairs in column, that is, a first pair and a second pair in the direction in which an object (an intruder or a dog) is moving, both pairs of areas being differentially connected in parallel with opposite polarity to the other pair. Signals received in each area are totaled, and then drawn. More specifically, an electric charge in each area upon incidence of an infrared ray is discharged through a resistance and is subjected to impedance conversion by the field-effect transistor F. Then a signal is drawn after it is amplified through the resistances R2 and R3 both connected to a d.c. source of power +B. The same occurs in the sensor D2. A pair in row are differentially connected to the other pair in row in parallel with opposite polarity.

The signals detected in this way are amplified by amplifiers 21 and 22, and supplied to peak holding circuits 23 and 24 where positive and negative peak values in each series of outputs are determined and held. The peak value signals are sent to an arithmetic unit 25 at a given time interval where a difference between the two peak values is calculated. An output from the arithmetic unit 25 is input to a decision circuit 26 where the magnitude is decided for the reference level; if it is larger than the reference level, a signal is output.

Figure 9:
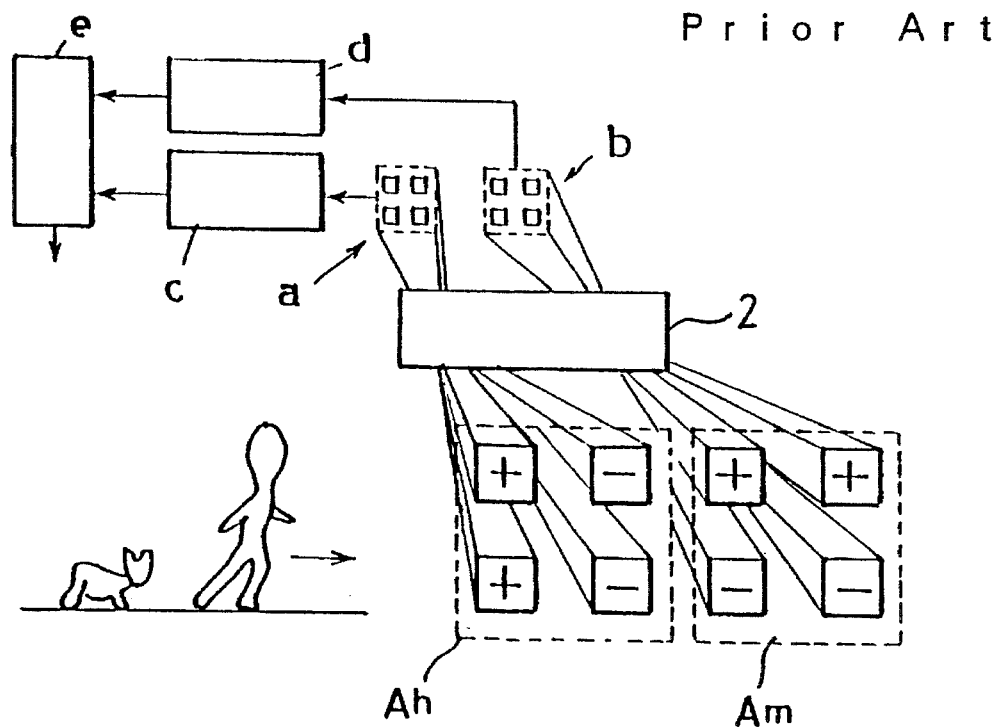
FIGS. 9 and 10 are explanatory views illustrating arrangements in common use for detecting an intruder.

In FIG. 9, the region Ah is to detect a human intruder and the region Am is to detect an animal intruder. The two regions Ah and Am are arranged at the same spot specified by the regions A1 to A4. When an intruder is a small animal like a dog, no signal is generated irrespective of any difference between the temperature of a moving object and the ambient temperature.

Figure 4:
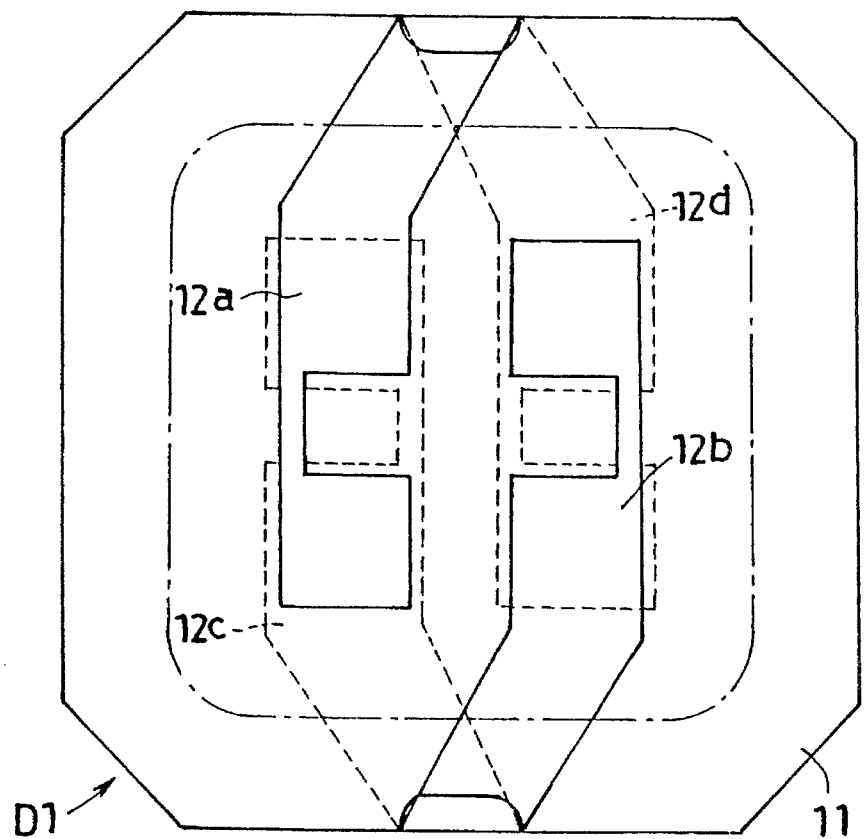
FIG. 4 is a plan view showing a pattern formed on the top surface of an infrared detecting element.
Figure 5:
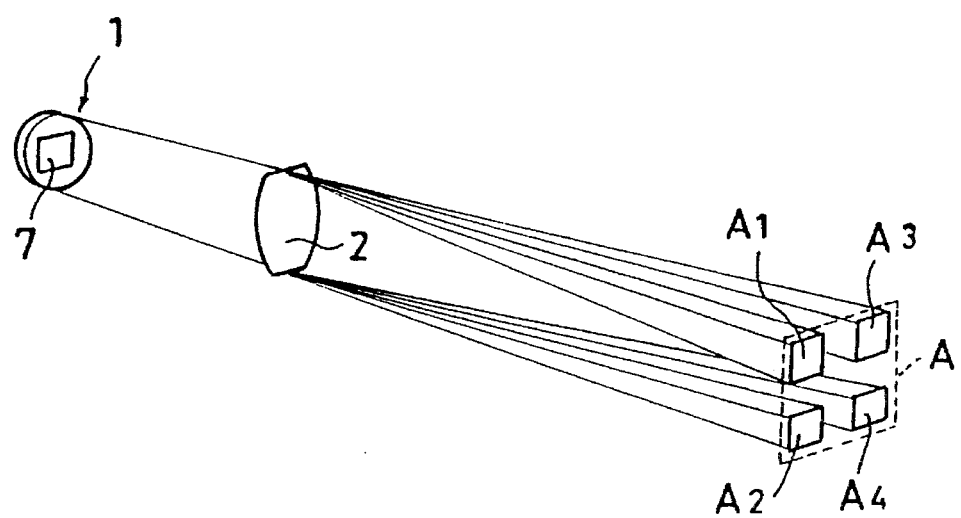
FIG. 5 is a diagrammatic view showing an intruder detecting system using a detector according to the present invention.
Figure 7:
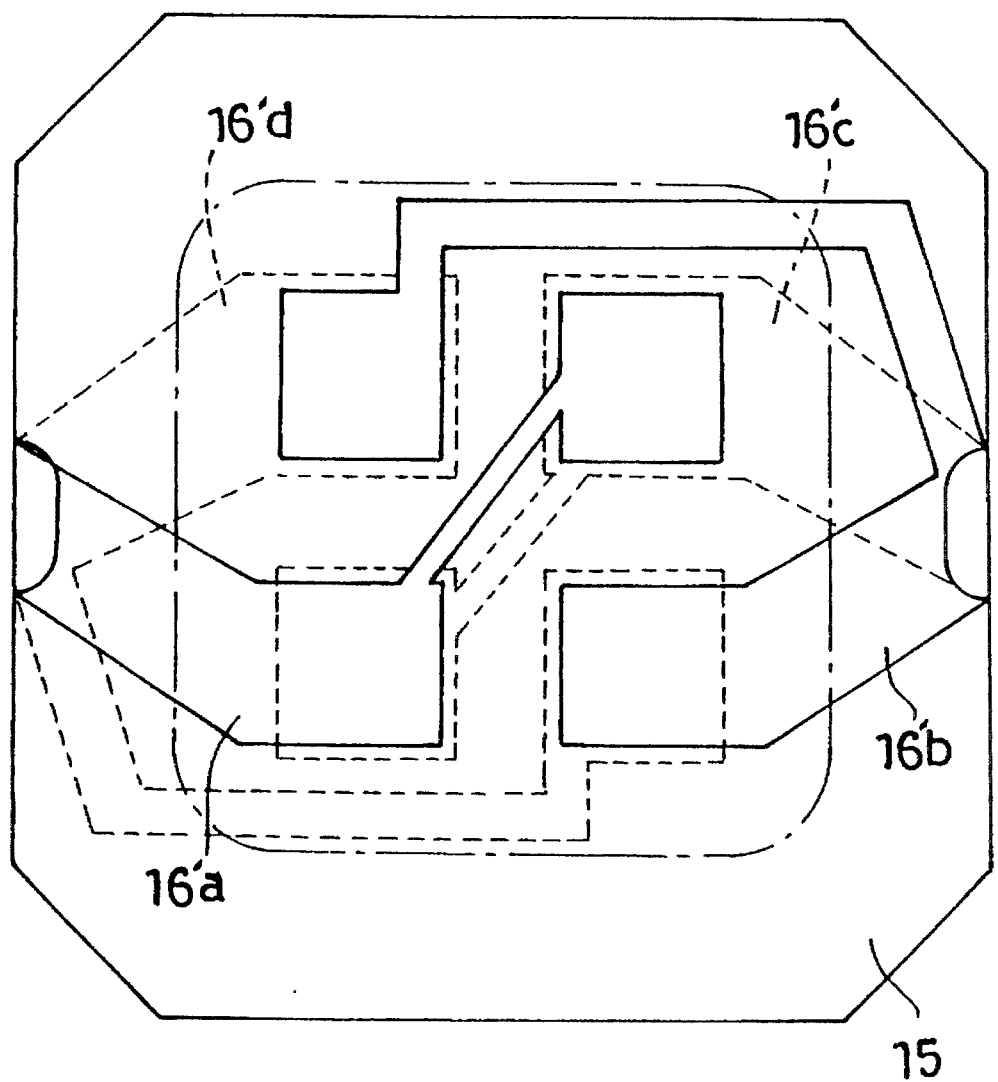
FIG. 7 is a plan view showing a modified pattern formed on the surface of an infrared detecting element.
Figure 10:
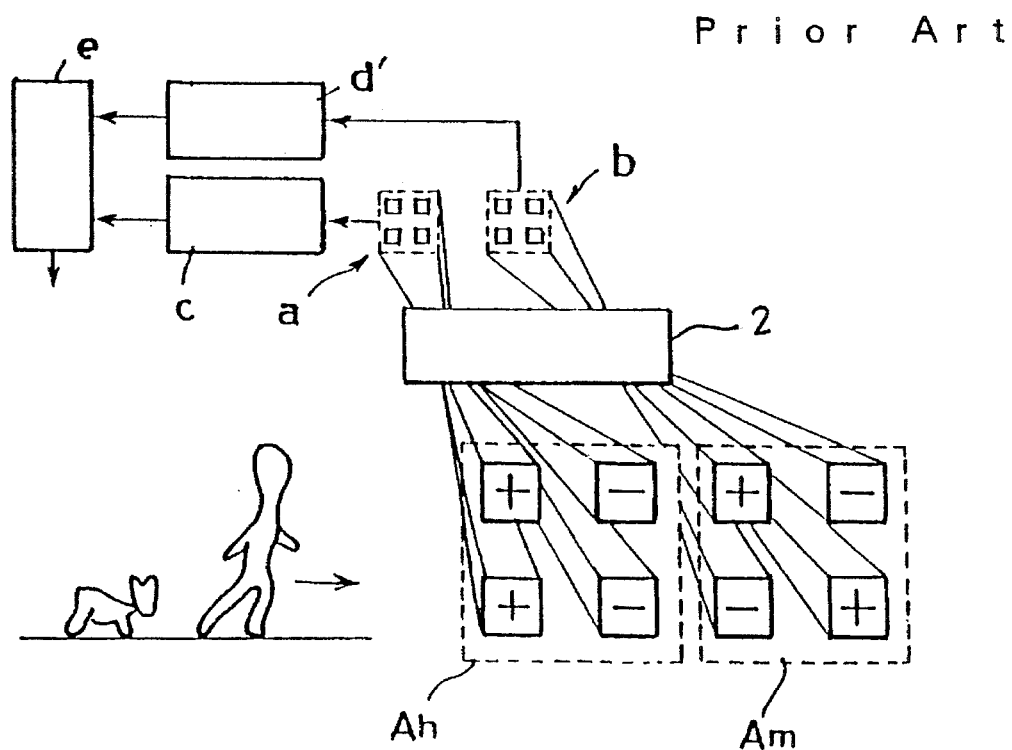

Referring to FIGS. 7 and 10, a modified version of the embodiment will be described:

In this embodiment, the electrodes 16'a to 16'd of the sensor D2 are formed in a different pattern from that shown in FIG. 4. The electrodes 16'a and 16'b are arranged in a modified pattern on the top surface of the sensor D2 and electrodes 16'c and 16'd on the bottom surface which constitute light accepting areas in the same manner as described above with respect to the first example. Likewise, the light accepting areas are spaced two by two in row and in column. Unlike the first example, a diagonal pair of light accepting areas are connected to each other with the same polarity whereas they are differentially connected to the other pair. The other sensor D1 has the same arrangement of electrodes as that shown in FIG. 4. The same circuit as that shown in FIG. 6 is used. The detection regions are shown in FIG. 10.

Figures 11A, 11B, 11C:
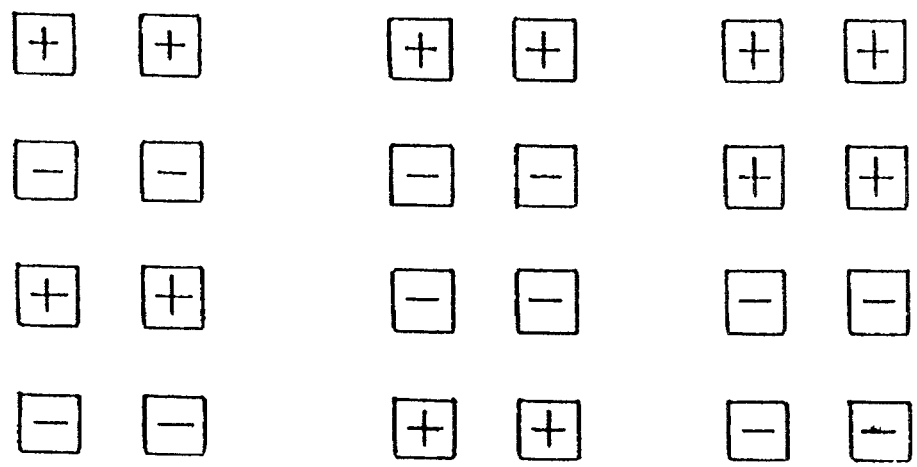
FIGS. 11(A) to (C) show various patterns of infrared ray receiving regions, particularly adapted for the arrangement shown in FIG. 9.
Figures 12A, 12B, 12C:
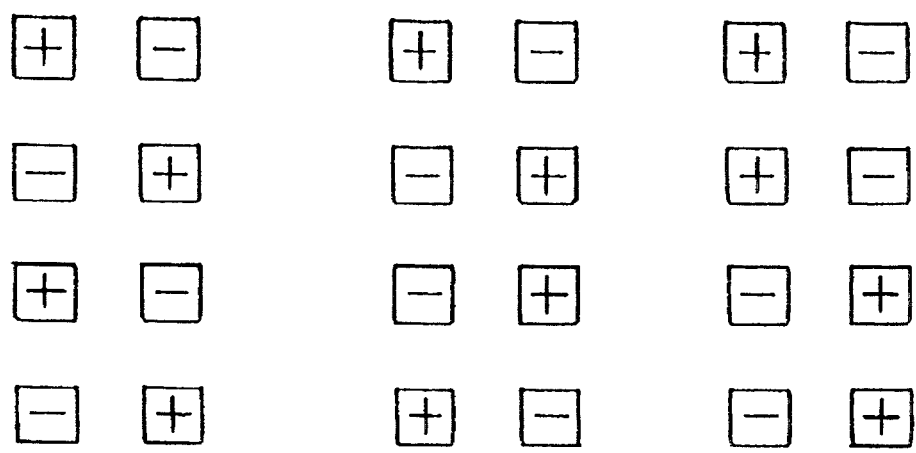
FIGS. 12(A) to (C) show various patterns of infrared ray receiving regions, particularly adapted for the arrangement shown in FIG. 10.
Figure 13:
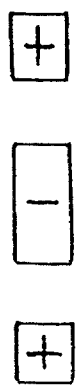
FIG. 13 shows another modified pattern used in the present invention.
Figure 14:
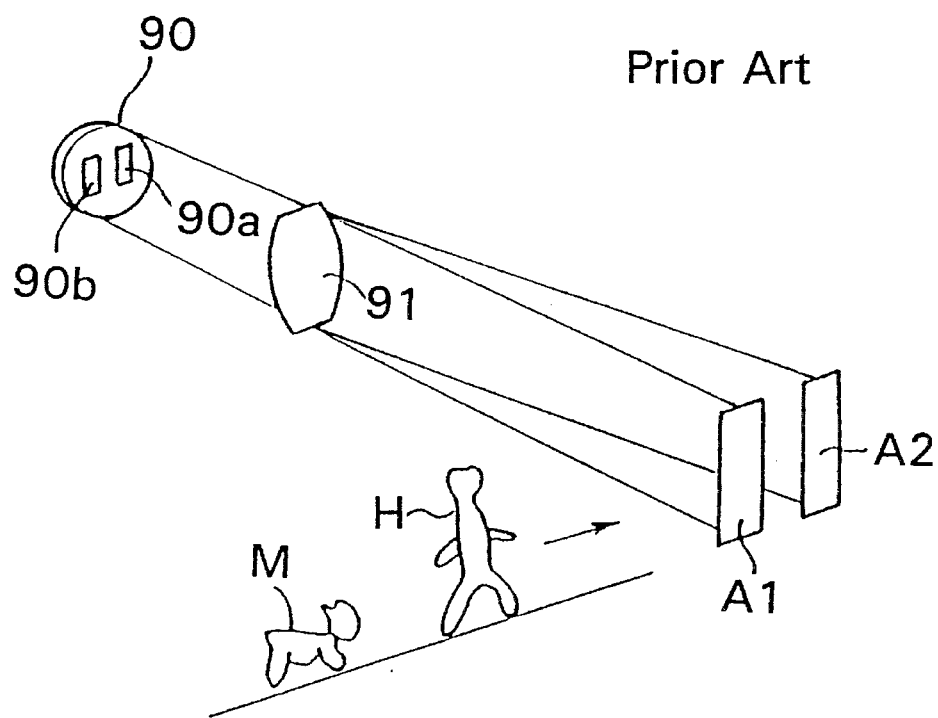
FIG. 14 shows a diagrammatic explanatory view exemplifying a known intruder detecting system.
Figure 15A:
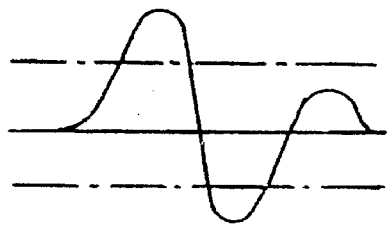
FIGS. 15(A) and 15(B) show signal waveforms obtained under the pattern shown in FIG. 12 when the difference between the ambient temperature and the temperature of a moving object is small.
Figure 15B:
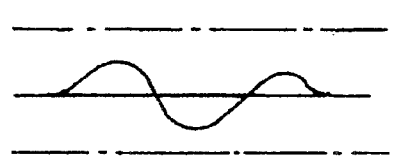
Figure 16A:
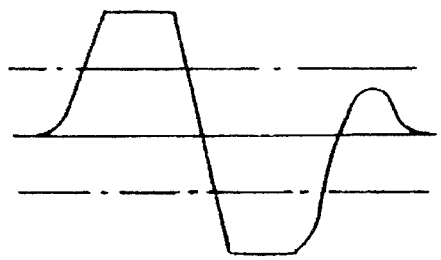
FIGS. 16(A) and 16(B) show signal waveforms obtained under the pattern shown in FIG. 12 when the difference between the ambient temperature and that of a moving object is great.
Figure 16B:
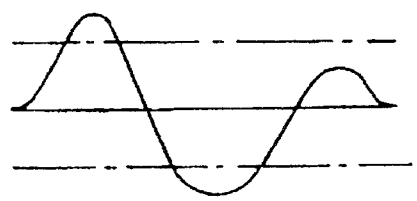

In the illustrated embodiments each sensor D1 and D2 has two pairs of light accepting areas in row and in column, but the present invention is not limited to these arrangements. It is of course possible to modify the arrangement and number of light accepting areas so long as the resulting detection areas are under the arrangements shown in FIGS. 9 and 10; for example, it is possible to provide each sensor D1 and D2 with four regions in row and two regions in column. The regions Am in FIG. 9 can be spaced in various manners as shown in FIGS. 11(A) to (C). Those in FIG. 10 can be spaced as shown in FIGS. 12(A) to (C). In these cases, the light accepting areas on the sensors D1 and D2 must be accordingly modified. The region Ah for monitoring a human intruder can be arranged as shown in FIG. 13, which exemplifies light accepting areas in column. The total area of the two (+) portions is equal to the area of the (−) portion so that the outputs from a first circuit c are cancelled, thereby becoming equivalent to the arrangements shown in FIGS. 9 and 10. When the arrangement shown in FIG. 13 is adopted, the light accepting areas must be accordingly arranged on the sensors D1 and D2.

Figure 8:
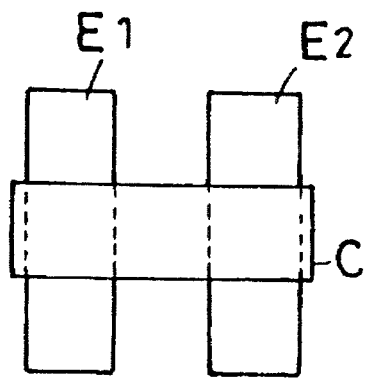
FIG. 8 is a plan view showing another modified pattern.

In the illustrated embodiments the electrodes are arranged on the pyroelectric films 11 and 15 covering the sensors D1 and D2 in such a manner as to form a particular pattern of light accepting areas but, as shown in FIG. 8, it is possible to form a desired pattern by covering unnecessary portions of the accepting areas with an infrared ray shut-off film. In FIG. 8, the two electrodes E1 and E2 are formed in parallel with either of the sensor D1 or D2, and an infrared ray shut-off film C is laid covering both electrodes E1 and E2. In this way the same detection region as that shown in FIG. 4 is obtained on the sensor D1 or D2, as the case may be. On the other sensor D2 or D1 the light accepting areas in column cannot be connected to each other with the same polarity, and the pattern shown in FIG. 8 is turned at 90°. In this way light accepting areas interconnected in the same manner as when the pattern of FIG. 4 is turned at 90° are obtained.

Figure 17:
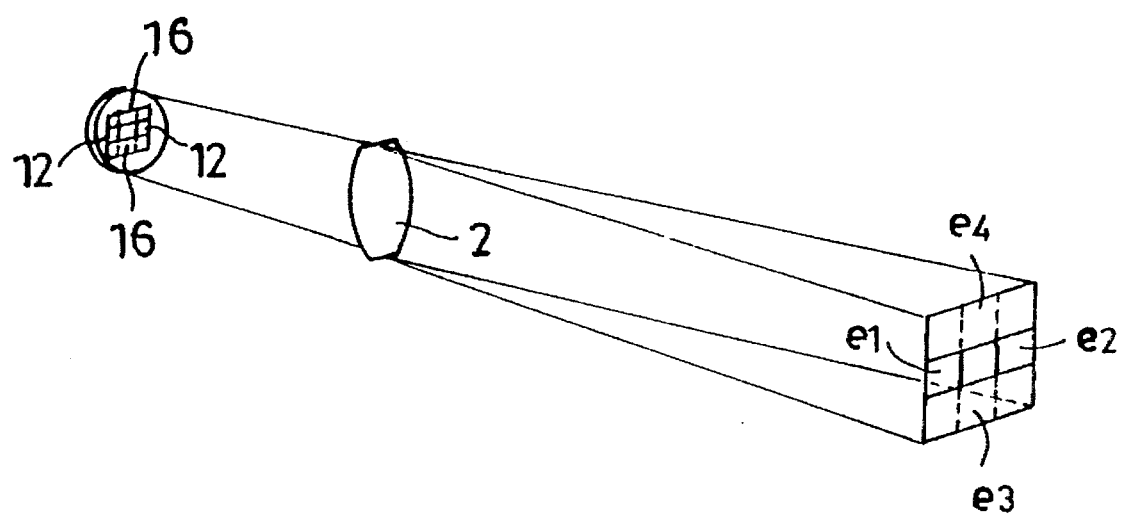
FIG. 17 is a diagrammatic view showing a modified version of the embodiment.

Referring to FIG. 17, another example of the arrangement of the detection regions will be described:

The detection region group is designed to include regions e1 to e4 in such a manner that the sensor D1 is located with respect to the optical system 2 so as to allow the detection regions e3 and e4 to be vertically arranged to cover human heights, and that the sensor D2 is located with respect to the optical system 2 so as to allow the detection regions e1 and e2 to be horizontally arranged one above another corresponding to a small animal. The upper region e4 is designed to detect an animal walking on a higher place or jumping or flying. The operation is performed as shown in FIG. 6.

Figures 18A, 18B, 18C:
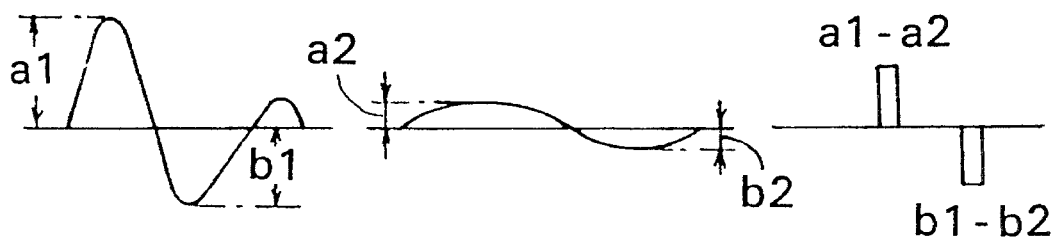
FIGS. 18(a) to 18(c) show the waveforms of signals obtained when a human passes through the detection regions.

Referring to FIGS. 18(a) to 18(c) and 19(a) to 19(c), the modes of signals obtained under the arrangement of FIG. 17 will be described: When a human passes through the detection region e1 first and then region e2 covering the whole area of each region, the sensor D1 corresponding to the regions e1 and e2 outputs a signal having a large plus peak a1 and a large minus peak b1 as shown in FIG. 18(a). The sensor D2 corresponding to the regions e3 and e4 outputs signals but since the same human passes through the regions e3 and e4 simultaneously, the signals from the electrodes 16 negate each other because of the differential connection. The resulting signal has a flat waveform with low plus peak a2 and minus peak b2 as shown in FIG. 18(b). These signals are held in the peak holding circuits 23 and 24 and then are delivered to the arithmetic circuit 25 where the plus small peak a2 is subtracted from the plus large peak a1 and the minus small peak b2 is subtracted from the large minus peak b1. Thus, a clearly peaked signal is output as shown in FIG. 18(c). Finally, this clearly peaked signal is compared with a reference value. If it exceeds the reference value, it tells that the intruding object is a human.

Figures 19A, 19B, 19C:
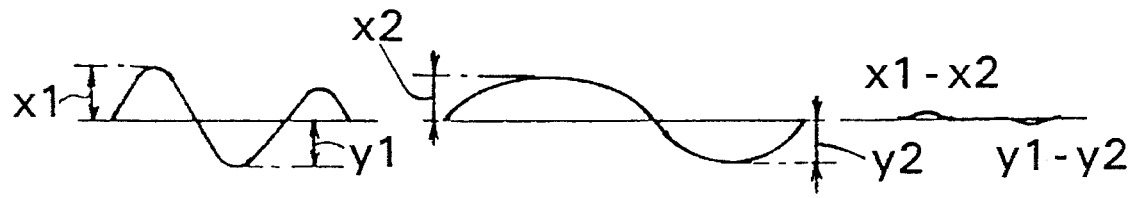
FIGS. 19(a) to 19(c) show the waveforms of signals obtained when an animal passes through the detection regions.

When an animal passes through the detection regions e1 to e4, it is too small to cover the whole area of each region. When it passes through the regions e1 and e2, a weak signal is output having a low plus peak x1 and a low minus peak y1 as shown in FIG. 19(a). When the same animal passes through the region e3, wherein it cannot reach the region e4, the signal has a flat waveform having a small plus peak x2 and a small minus peak y2, which is almost the same as those in FIG. 19(a). Likewise, these peak values x1, y1, x2, and y2 are held at the peak holding circuits 23 and 24 and then the subtraction is made between these peaks at the arithmetic circuit 25. The resulting signal has a flat waveform as shown in FIG. 19(c), which is compared with the reference value. It is easy to ascertain that the level is below the reference value and conclude that the intruding object is not a human.

Figure 20:
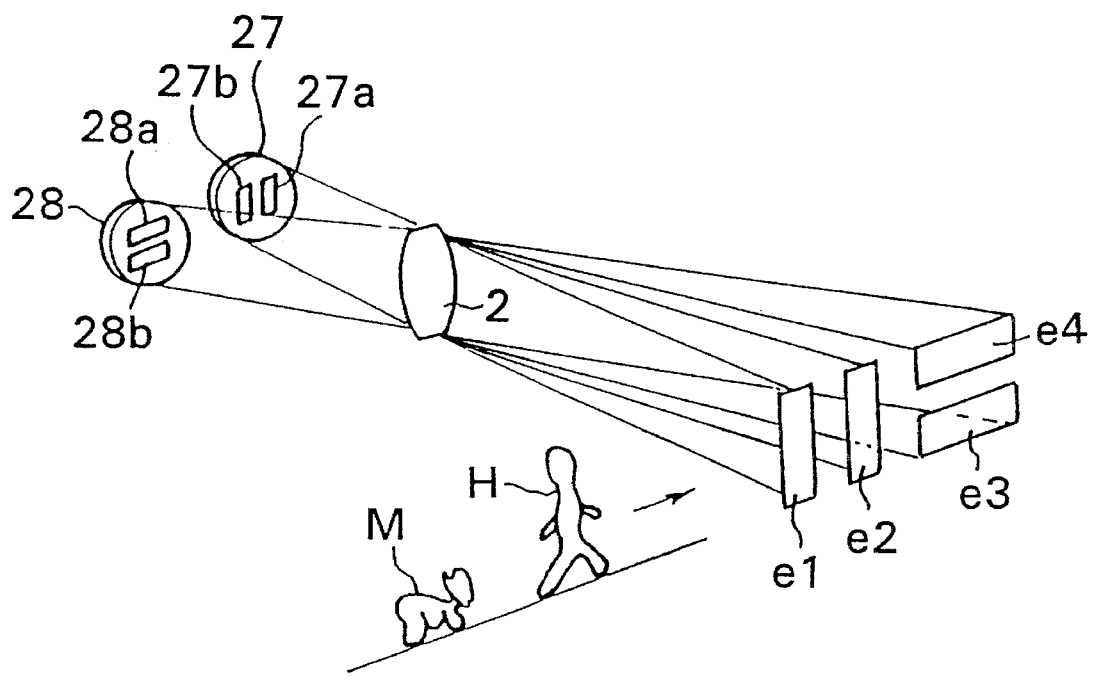
FIG. 20 is a diagrammatic view showing an example of the applications using the intruder detecting system of the present invention.

FIG. 20 shows an example of the known passive intrusion detection systems that uses uniquely arranged detection regions e1 to e4 according to the present invention wherein the regions e1 and e2 are vertically arranged and the regions e3 and e4 are horizontally arranged one above another. Detectors 27 and 28 are provided in such a manner that the sensors 27a and 27b are differentially connected in the detector 27 and correspond to the regions e1 and e2, and the sensors 28a and 28b are differentially connected in the detector 28 and correspond to the regions e3 and e4, both through the common optical system 2.

Figure 21:
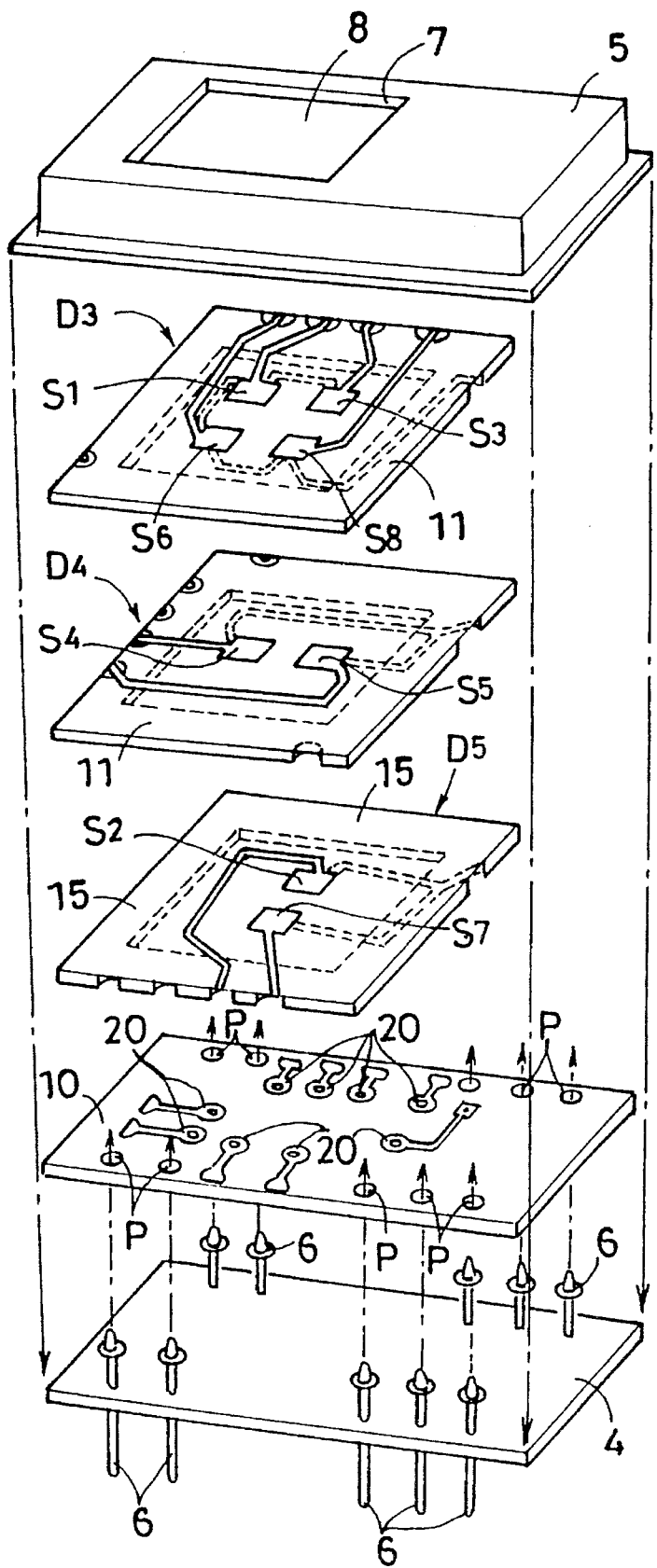
FIG. 21 is a perspective exploded view showing another example of the infrared detector embodying the present invention.
Figures 22, 23:
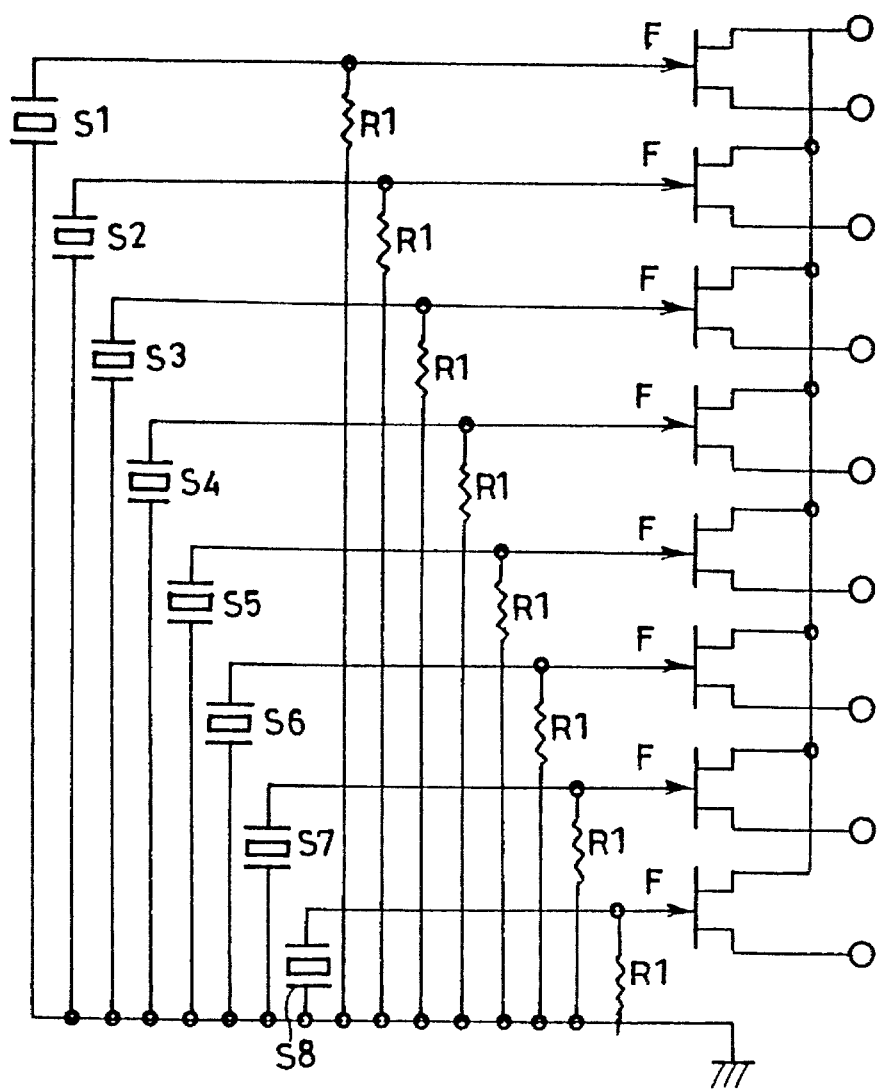
FIG. 22 is a diagrammatic view showing an arrangement of electrodes on the light accepting surface.
FIG. 23 is a circuit diagram of the electrodes of FIG. 22.

FIG. 21 shows a modification to the embodiment illustrated in FIG. 1, characterized in that the detectors D3 to D5 are laid one above another in such a manner that the light receiving ares S1 to S8 are arranged in a block form as a whole as shown in FIG. 22, which are equivalent to the light receiving areas 12 and 16. The output of each area S1 to S8 is individually taken as shown in FIG. 23.

Referring to FIG. 21, wherein like reference numerals denotes like elements and components to those in FIG. 1, the detector D3 is provided with four sensors (electrode) S1, S3, S6 and S8 on the pyroelectric film 11 at each corner. The detector D4 is provided with two sensors (electrodes) S4 and S5 on the pyroelectric film 11 in such a manner that they are located at places corresponding to between the sensors S1 and S6, and between the sensors S3 and S8 of the detector D3. Likewise, the detector D5 is provided with two sensors (electrodes) S2 and S7 in such a manner that they are located at places corresponding to spaces existing between the sensors S1 and S3, and between the sensors S6 and S8 of the detector D3. The arrangement of these sensors S1 to S8 is shown in FIG. 22. In this embodiment, neither of the sensors S1 to S8 overlaps. The signal from each sensor is individually detected so that the system can be designed so as to enable the detector to generate an intruder detecting signal only when all the sensors respond to the passage of the human intruder. The human intruder covers a wide field of view defined by the detection regions corresponding to the sensors S1 to S8.

FIGS. 24(a) to 24(d) show various arrangements of the sensors S1 and S2. The arrangements shown in FIGS. 24(a) and 22(d) are the same in position but different in polarity. FIG. 24(b) shows that the sensors S1 to S4 are slightly spaced, and FIG. 24(c) shows that the sensors partly overlap.

FIGS. 25(A) to 25(C) show examples of the electric connection between the light receiving electrodes (sensors) S1 to S4. FIG. 25(A) shows that the sensors S1 to S4 are alternately connected with opposite polarity, and the signal of each sensor may be individually detected. FIG. 25(B) shows that the sensors S1 and S2, and S3 and S4 are grouped into two pairs each of which consists of sensors S1 and S2 connected in parallel with the same polarity. FIG. 25(C) shows that the sensors S1 to S4 are alternately connected in parallel with opposite polarity so as to combine the signals as an output.

What is claimed is:

1. A pyroelectric infrared detector used in an intrusion detection system, the detector comprising:

a housing having an opening;

a light transmissive filter covering the opening in the housing;

a group of at least two infrared transmissive pyroelectric layers, each layer having a top surface and a bottom surface, the top surface of each layer facing the opening, and each layer in the group of layers disposed in layered relation with respect to each other layer;

a substrate layer electrically connected to each pyroelectric layer in the group of layers, the substrate layer located such that the group of layers is between the substrate layer and the opening, the substrate layer comprising an electric circuit including a field-effect transistor for converting an impedance;

a plurality of electrodes, at least one electrode formed on each of the top and bottom surfaces of each of the pyroelectric layers for transmitting electric charges occurring on each of the top surfaces caused by thermal changes due to infrared incidence on each top surface; and means for supporting the group of pyroelectric layers and the substrate layer at spaced intervals so that the substrate layer and the group of pyroelectric layers are free from mutual thermal influence.

2. The pyroelectric infrared detector according to claim 1, wherein each layer of the group of pyroelectric layers is an infrared transmissive polymetric layer.

3. The pyroelectric infrared detector according to claim 1, wherein each layer of the group of pyroelectric layers is an infrared transmissive ceramic.

4. The pyroelectric infrared detector according to claim 1, wherein each layer in the group of layers includes a first electrode on the top surface thereof and a second electrode on the bottom surface thereof, each such first and second electrodes at least partly overlapping each other to form a column infrared ray accepting area in one layer and a row infrared ray accepting area in the other layers of the group of layers, wherein each of the column and row infrared ray accepting areas is associated with a field-effect transistor and an output terminal connected to the transistor.

5. The pyroelectric infrared detector according to claim 4, wherein each of the column and row infrared ray accepting areas is divided into at least two portions.

6. The pyroelectric infrared detector according to claim 5, wherein the at least two portions of infrared ray accepting areas in each column are connected to each other with the same polarity and wherein the at least two portions of infrared ray accepting areas in each row are connected to each other with opposite polarity so as to cancel changes in ambient temperature and brightness.

7. The pyroelectric infrared detector according to claim 4, wherein the column infrared ray accepting area comprises at least two columns connected to each other with opposite polarity and wherein each row infrared ray accepting area comprises at least two rows connected to each other with opposite polarity so as to cancel changes in ambient temperature and brightness.

8. The pyroelectric infrared detector according to claim 7, wherein each of the column and row infrared ray accepting areas is divided into at least two portions.

9. The pyroelectric infrared detector according to claim 8, wherein the at least two portions of infrared ray accepting areas in each column are connected to each other with the same polarity and wherein the at least two portions of infrared ray accepting areas in each row are connected to each other with opposite polarity so as to cancel changes in ambient temperature and brightness.

10. A pyroelectric infrared detector used in an intrusion detection system, the detector comprising:

a housing having an opening for admitting light into the housing;

a light transmissive filter for filtering the light entering the housing;

at least two infrared sensors, each sensor comprising an infrared transmissive pyroelectric layer, wherein each layer has a top surface and a bottom surface, the top surface of each layer facing the opening and receiving the light thereon, and wherein the sensors are in layered relationship to each other within the housing;

a substrate layer comprising an electrical circuit, the substrate layer located beyond the at least two sensors and electrically connected to each of the sensors for providing a detection signal; and means for supporting the at least two sensors and the substrate layer at spaced intervals so that the substrate layer and the at least two sensors are free from mutual thermal influence.

11. The pyroelectric infrared detector of claim 10 wherein each infrared sensor further comprises a base plate for supporting its infrared transmissive pyroelectric layer.

12. The pyroelectric infrared detector of claim 11 wherein each base plate includes an aperture for allowing light to pass therethrough.

13. The pyroelectric infrared detector of claim 11 wherein each infrared transmissive pyroelectric layer is constructed from a ceramic material.

14. The pyroelectric infrared detector of claim 11 wherein each infrared sensor includes at least two infrared ray receiving areas.

15. The pyroelectric infrared detector of claim 11 wherein the at least two infrared sensors comprise a first sensor disposed above a second sensor, wherein the second sensor placed at a 90° angular displacement with respect to the first sensor.

16. The pyroelectric infrared detector of claim 15 wherein the second sensor receives light through an aperture in the first sensor.

* * * * *